US006603861B1

(12) United States Patent
Maisano et al.

(10) Patent No.: US 6,603,861 B1
(45) Date of Patent: Aug. 5, 2003

(54) METHOD FOR ELECTRONICALLY BEAM FORMING ACOUSTICAL SIGNALS AND ACOUSTICAL SENSOR APPARATUS

(75) Inventors: Joseph Maisano, Neuchâtel (CH); Werner Hottinger, Neuchâtel (CH)

(73) Assignee: Phonak AG, Stafa (CH)

(*) Notice: Subject to any disclaimer, the term of this patent is extended or adjusted under 35 U.S.C. 154(b) by 0 days.

(21) Appl. No.: 09/168,184

(22) Filed: Oct. 7, 1998

Related U.S. Application Data

(63) Continuation-in-part of application No. 08/918,694, filed on Aug. 21, 1997, now abandoned.

(30) Foreign Application Priority Data

Aug. 20, 1997 (EP) ........................................ 97114413

(51) Int. Cl.[7] ........................................ H03R 3/00
(52) U.S. Cl. ........................ 381/92; 381/91; 381/122
(58) Field of Search ........................ 381/91, 92, 122, 381/26, 95, 111, 356

(56) References Cited

U.S. PATENT DOCUMENTS

| | | | | | |
|---|---|---|---|---|---|
| 4,536,887 A | | 8/1985 | Kaneda et al. | ........ | 381/58 |
| 5,193,117 A | * | 3/1993 | Ono et al. | ........ | 381/92 |
| 5,226,087 A | * | 7/1993 | Ono et al. | ........ | 381/92 |
| 5,473,701 A | * | 12/1995 | Cezanne | ........ | 381/92 |
| 5,581,620 A | | 12/1996 | Brandstein et al. | ........ | 381/92 |
| 5,586,191 A | * | 12/1996 | Elko et al. | ........ | 381/92 |
| 5,602,962 A | * | 2/1997 | Kellermann | ........ | 381/92 |
| 5,633,935 A | * | 5/1997 | Kanamori et al. | ........ | 381/26 |
| 5,684,882 A | | 11/1997 | Mahieux et al. | ........ | 381/92 |
| 6,317,501 B1 | * | 11/2001 | Matsuo | ........ | 381/92 |
| 6,385,323 B1 | * | 5/2002 | Zoels | ........ | 381/92 |

FOREIGN PATENT DOCUMENTS

| | | |
|---|---|---|
| EP | 0 289 401 | 11/1988 |
| EP | 0 652 686 | 5/1995 |
| GB | 2 212 619 | 7/1989 |

OTHER PUBLICATIONS

Evaluation of an adaptive beamforming method for hearing aids, 8014 The Journal of the Acoustical Society of America, 91 (1992) Mar., No. 3, New York, US, Julie E. Greenberg and Patrick M. Zurek.

* cited by examiner

*Primary Examiner*—Xu Mei
(74) *Attorney, Agent, or Firm*—Pearne & Gordon LLP

(57) ABSTRACT

A predetermined characteristic of amplification in dependency of the direction (θ) from which acoustical signals are received at two spaced apart acoustical/electrical transducers (1, 2) is formed in that repetitively a mutual delay signal ($A_{10}$) is determined from the output signals of the transducers and according to the reception delay at the transducers, one ($S_1$) of the output signals is filtered, thereby the filtering transfer characteristic is controlled in dependency of the mutual delay signal ($A_{12}$). The output signal of the filtering (14) is exploited as electrical reception signal ($S_r$).

31 Claims, 8 Drawing Sheets

METHOD FOR ELECTRONICALLY BEAM FORMING ACOUSTICAL SIGNALS AND ACOUSTICAL SENSOR APPARATUS

This is a continuation-in-part of U.S. Ser. No. 08/918,694 filed Aug. 21, 1997, abnd.

The present invention is generically directed on a technique for so-called "beam forming" on acoustical signals.

The use of directional acoustical/electrical transducers and especially of such microphones is one of the most efficient ways for improving signal to noise ratio in audio systems. It is known to realise directional microphones by using an array of microphone cells and time delaying and superimposing the output signals of such cells following up the known "delay and sum" technique.

Figure 1:
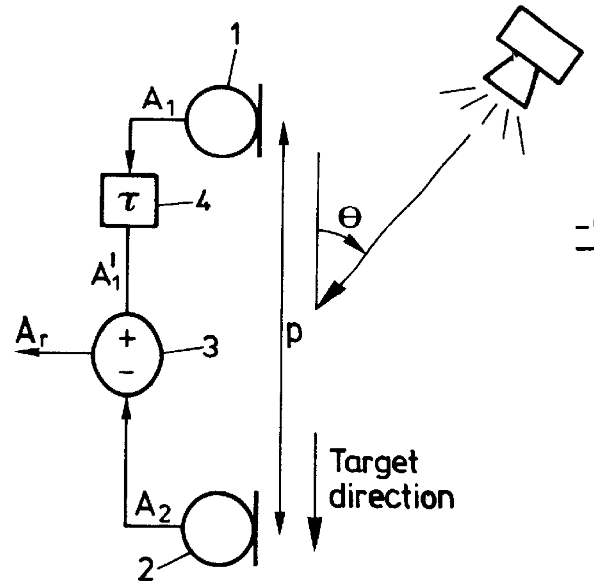
Figure 2:
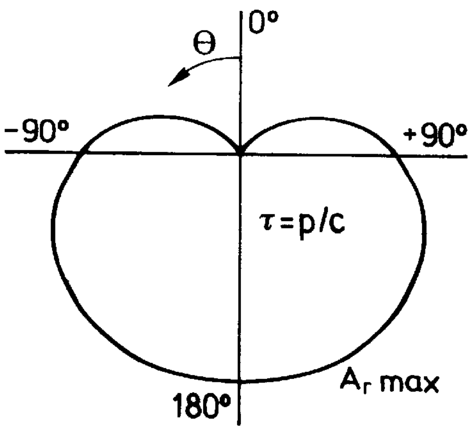

With two omnidirectional microphone cells this known principle is shown in FIG. 1. Two omnidirectional microphones, 1 and 2, are provided with a mutual distance p. The output signal of one of the microphones according to signal A1 is time delayed by the time amount $\tau$, the time delayed signal according to $A_1'$ is superimposed at a superimposing unit 3 to the undelayed output signal $A_2$ of microphone 2. At the output of the superimposing unit 3 there results the output signal $A_r$ with an amplification versus impinging angle $\theta$ characteristic, as shown in FIG. 2 for one frequency $\omega$ considered. Thereby, it is customary to select as delay time $\tau$ as the quotient of distance p and velocity of sound c. With this arrangement there results, as shown in FIG. 2, a first order cardoid characteristic. It may be shown that the amplitude of the resulting signal $A_r$ is proportional to the sine of the signal frequency $\omega$ and to the distance p. The maximum gain in target direction (180°) occurs at the frequency $f_r=c/(4p)$ . For a distance p of 12 mm, $f_r$ becomes approx. 7 kHz.

By staggering more than one of the FIG. 1 double-cell arrangements and superimposing the resulting signals $A_r$ of the more than one double-cell arrangements, higher order cardoid characteristics may be realised.

Figure 3:
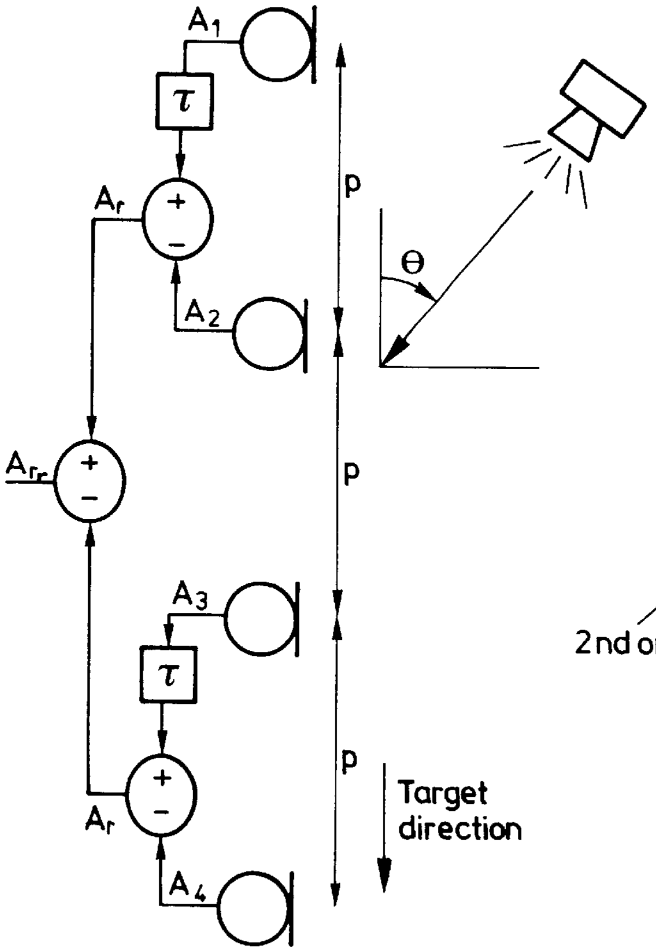
Figure 4:
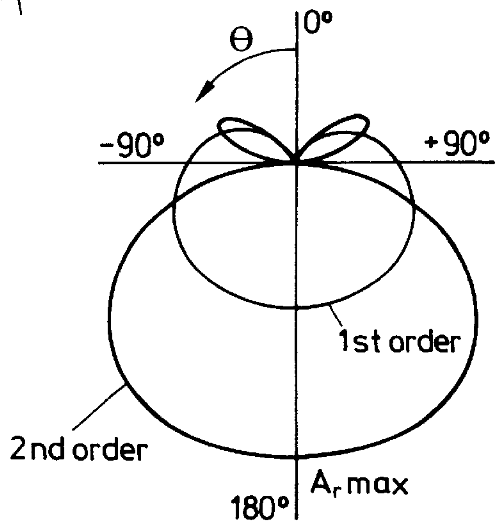

In FIG. 3 a known arrangement to realise second order cardoid characteristics according to FIG. 4 is shown. Thereby, a narrower beam can be achieved. The higher the order of the directional microphone arrangement, the higher becomes the directivity index and the gain at $f_r$, but the higher will also be the roll-off for low and high frequencies and the number of unwanted side-lobes. With respect to the definition of the directivity index please refer to speech communication 20 (1996), 229–240, "Microphone array systems for hands-free telecommunications", Garry W. Elko.

Figure 5:
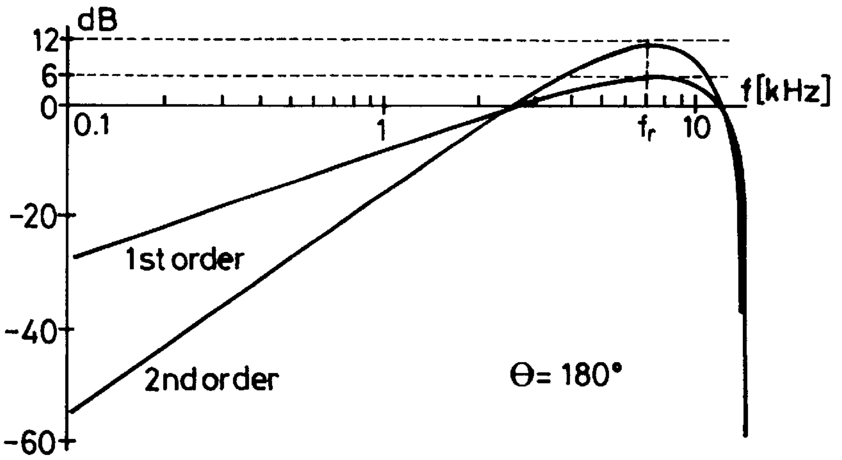

In FIG. 5 there is shown the gain versus frequency characteristic of the first and second cardoid characteristics for an impinging angle $\theta$=180°. Therefrom, high and low frequency roll-offs are clearly evident.

Such techniques for beam forming are well-known and have been realised using analogue signal processing, as e.g. shown in the U.S. Pat. Nos. 2,237,298, 4,544,927, 4,703,506, 5,506,908 or using digital signal processing, both in time or in frequency domain, as shown in the EP-A-0 381 498 (time domain) or in the U.S. Pat. No. 5,581,620 (frequency domain).

Beam formings realised with any of these principles has the following drawbacks:

a) The resulting signal is dampened at low frequencies, which results in a bad signal to noise ratio.

b) The directivity index is very sensitive to matching of the individual microphone cells, especially at low frequencies.

c) The distance p between the microphone cells should be large (>12 mm) for audio range.

d) The frequency band with a high gain in target direction is rather small, as may clearly be seen from FIG. 5.

e) The directivity largely depends upon the number of microphone cells and thus on the complexity of the overall arrangement.

f) As one aims for a high directivity by increasing the number of cells, more unwanted side-lobes are introduced.

Several techniques have been proposes to overcome some of these drawbacks:

In the WO 95/20305 (E. Lindemann) an adaptive noise reduction system for use in binaural hearing aid is proposed. It detects the power of the received signals to separate the desired from unwanted signals.

There is proposed a "broad side" microphone-cell array, i.e. target direction is perpendicular to the axis from one microphone to the other, in contrary to the arrangement according e.g. to FIG. 1 and the principles of the present invention, which is "in line".

The disclosed apparatus is bulky (>>5 cm), so that it may not be implemented for one ear hearing aid.

Two equal beam lobes are generated in target and in opposing directions.

In such a hearing aid a connection between the left and right ear system must be present, making the apparatus for hearing aid unhandy. Furthermore, as described by the same author in "Two microphone non-linear frequency domain beam former for hearing aid noise reduction" 1995, IEEE ASSP Workshop on Applications of Signal Processing to Audio and Acoustics, October 15–18, Mohonk, New Paltz, New York, such beam forming is efficient only up to about 2 kHz and leads to distortions of the desired signals.

The U.S. Pat. No. 4,653,102 proposes the use of two directional microphones aimed in target direction and of a third microphone aimed in opposite direction. The signal of the third microphone supposedly only containing noise is used to shape the response of the two primary microphones. This technique obviously has the drawback within reverberating rooms, where the desired signal is reflected on walls, floor, ceiling and furniture and is therefore considered as noise by the system. This technique is further unhandy as making use of at least three microphones.

Attention is further drawn to U.S. Pat. Nos. 5,400,409 and 5,539,859.

As an example of known beam-forming techniques, the U.S. Pat. No. 5,539,859 proposes a technique wherein reception characteristic is logged in on that direction wherefrom the highest energy impinges on a pair of microphones and considered in the sound environment. Principally, all sound impinging from directions other than from highest energy direction is considered as noise and its reception is cancelled.

Thereby, an analogue to digital conversion and subsequent time to frequency domain conversion is performed on the output signals of two microphones. Exploiting the knowledge of the fixed mutual distance between the two microphones, wherefrom phase difference of the impinging signal spectra is dependent, there is determined the mutual phasing and thus impinging direction of highest energy sound signals, i.e. direction of highest energy sound source within the acoustical surrounding. Signals impinging from that direction are amplified by means of inphase shifting and adding similarly to an auto correlation technique, whereby signals from other impinging angles are cancelled as noise.

By such a technique the energy distribution in the sound environment traps the selectivity of reception, and it is not possible to freely select or preselect a maximum reception characteristic, e.g. in direction wherefrom sound is desired to be selectively received, irrespective of its relative energy. One field whereat such selectivity irrespective of energy distribution within the sound surrounding would clearly be advantageous is hearing aid technique.

It is an object of the present invention to provide a method for electronically forming a predetermined characteristic of amplification in dependency of direction from which acoustical signals are received at at least two spaced apart acoustical/electrical transducers and a respective acoustical sensor apparatus, with which only a small number of microphones or microphone cells has to be used and which is thus enabling small and compact directional transducer or microphone realisation. Thereby, the preferred apparatus according to the present invention is a hearing aid apparatus, and especially a one ear hearing aid apparatus.

It is a further object to provide such method and apparatus with good frequency response in the audio band, i.e. between approx. 0.1 and 10 kHz.

Still a further object of the present invention is to provide such method and apparatus which allow high signal to noise ratio realisation without unwanted side-lobes and with easily variable beam form, e.g. for acoustical zooming.

These and other objects are realised by the inventive method, which comprises the steps of repetitively determining from signals dependent from the acoustical signals a respective mutual delay signal according to reception delay at the at least two transducers; subjecting a signal dependent from the output signal of at least one of the at least two transducers to filtering with a filtering transfer characteristic; and of controlling the filtering transfer characteristic in dependency of the mutual delay signal; further exploiting a signal dependent from the output signal of the filtering as electrical reception signal.

To fulfil the above mentioned objects the inventive acoustical sensor apparatus comprises at least two acoustical/electrical transducers, arranged at a predetermined mutual distance in target direction, a time delay detection unit, which has at least two inputs and an output, the inputs thereof being respectively operationally connected to the outputs of the two transducers, whereby the time delay detection unit generates an output signal in dependency of the time delay of acoustical signals, impinging on the at least two spaced apart transducers, preferably a time domain to frequency domain converter unit generating the output signal of said time delay detection unit in frequency domain; a weighing unit with a predetermined weighing characteristic and with an input and with an output, whereby the input thereof is operationally connected to the output of the time delay detection unit and preferably receiving the signal at said output of said time delay detection unit in frequency domain mode; with a filter unit with a controllable transfer characteristic, which has at least one input, a control input and an output and whereat the input is operationally connected to at least one of the outputs of the at least two transducers, preferably via at least one time domain to frequency domain converter, the control input is operationally connected to the output of the weighing unit, the filter unit generating an output signal in dependency of its input signal and of its transfer characteristic which is controlled by the signal—preferably a spectral signal—which is applied to the control input of the filter unit, this weighing—preferably spectral weighing—result signal being dependent from the output signal of the time delay detection unit and the weighing characteristic of the weighing unit.

Figure 6:
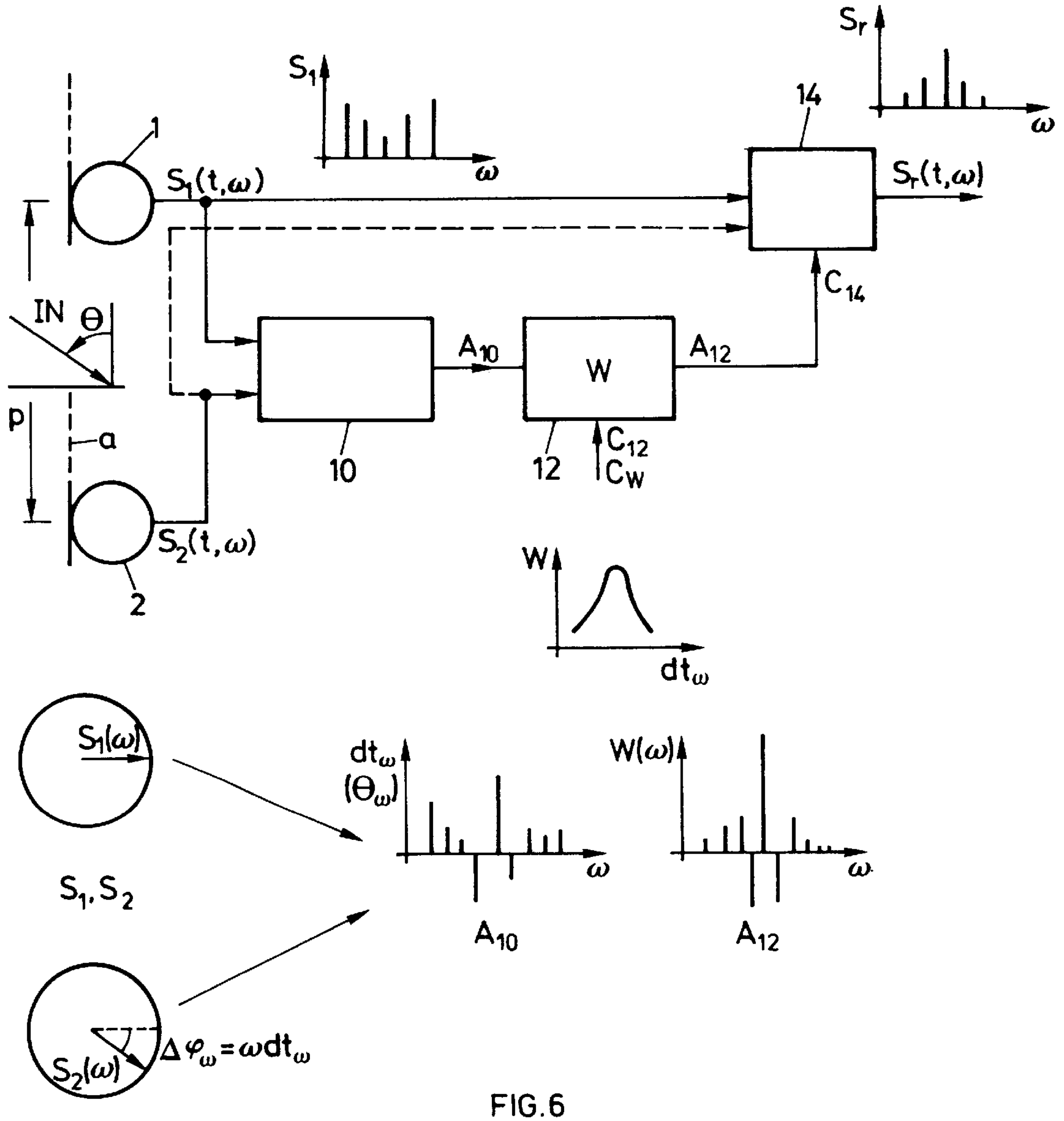
Figure 7:
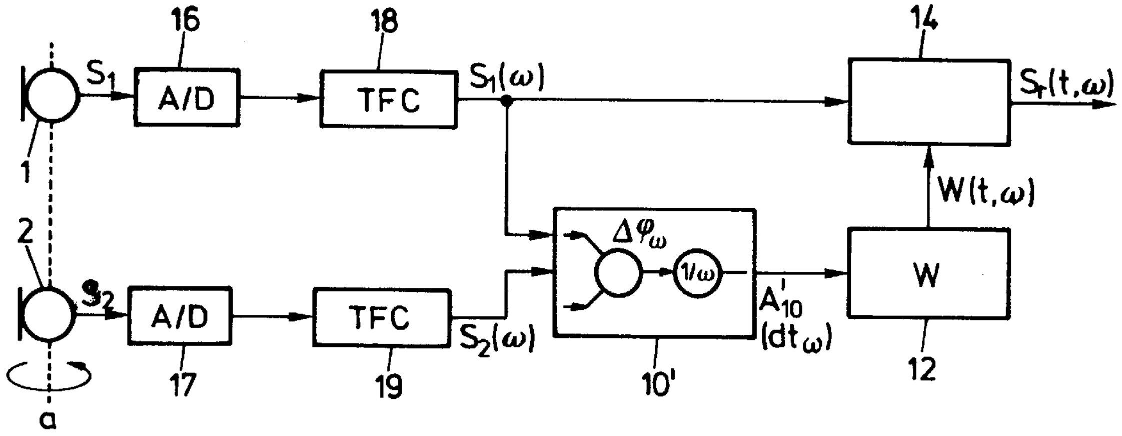
Figure 8:
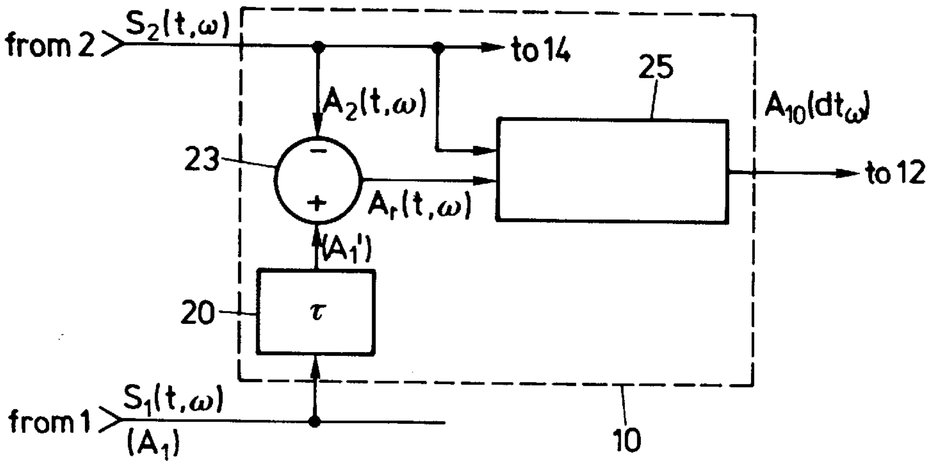
Figure 9:
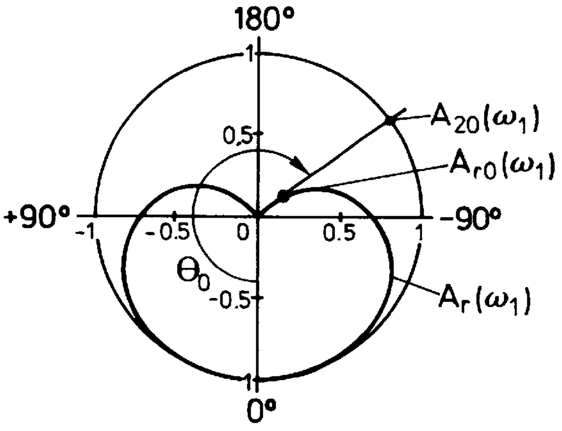
Figure 10:
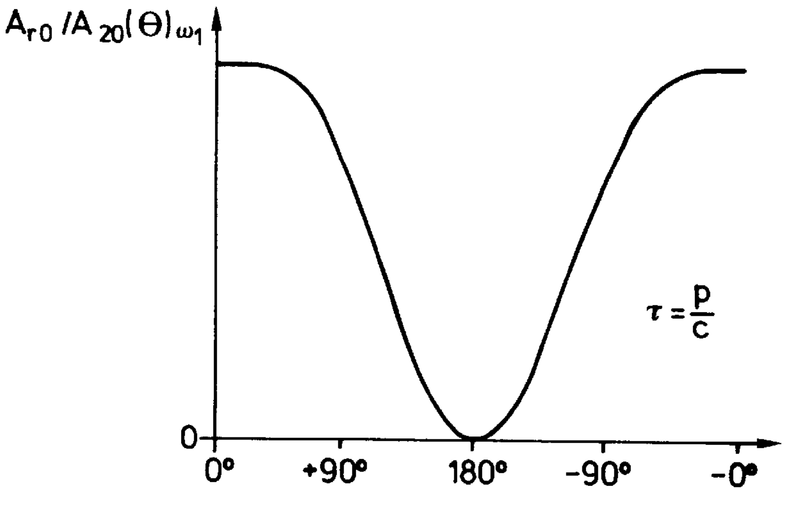
Figure 11:
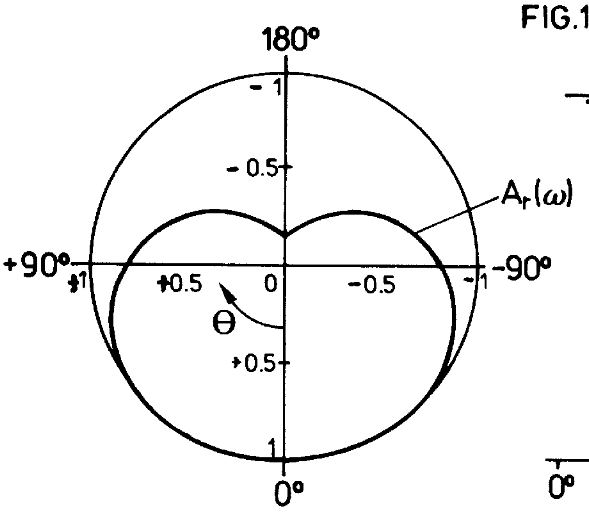
Figure 12:
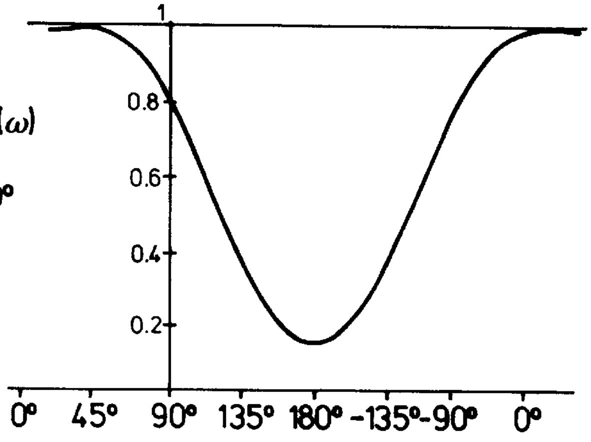
Figure 13:
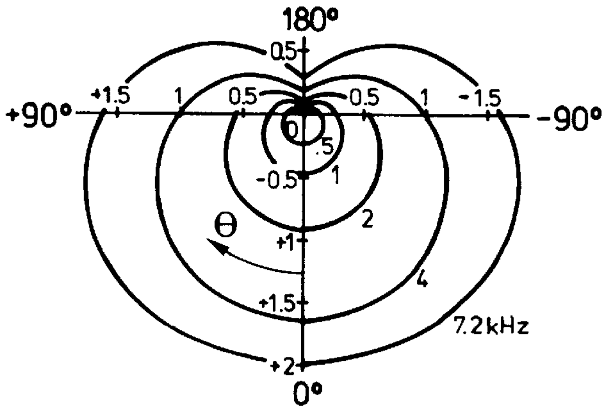
Figure 14:
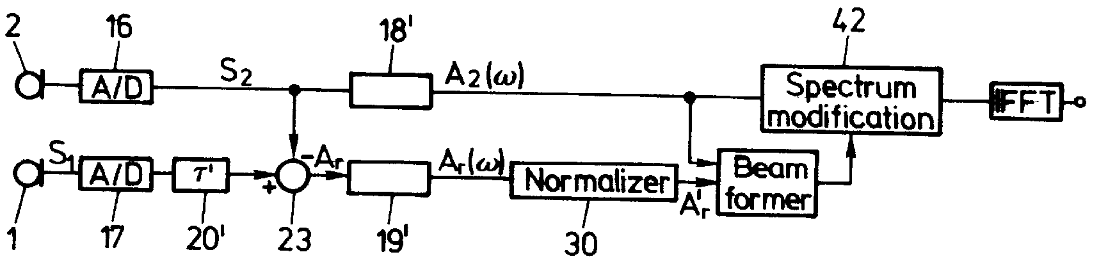
Figure 15:
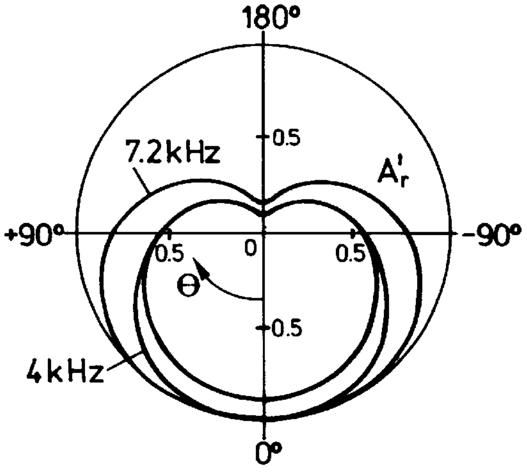
Figure 16:
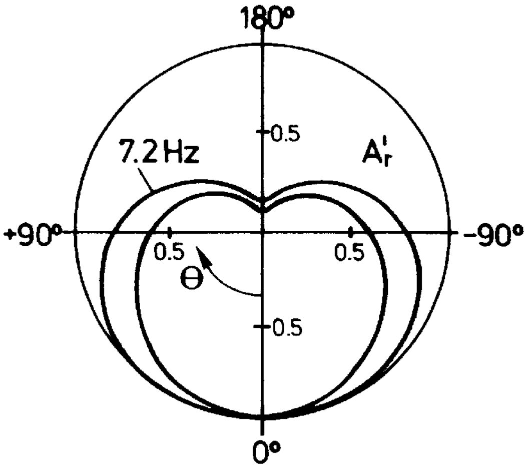
Figure 17:
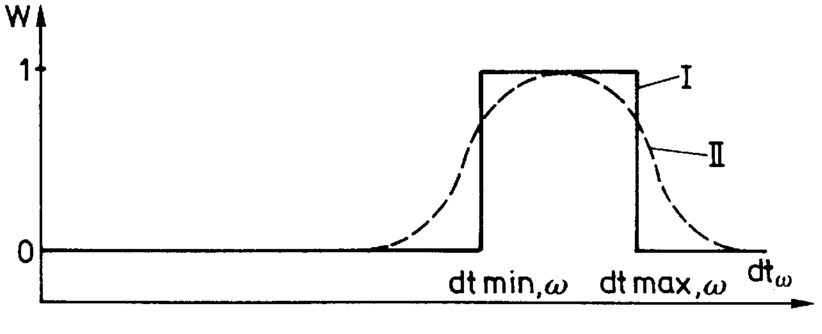
Figure 18A:
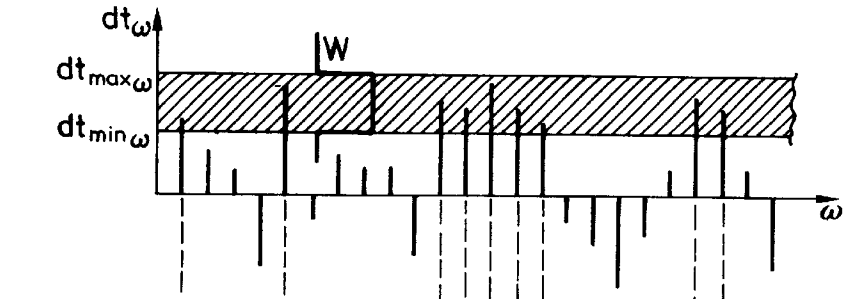
Figure 18B:
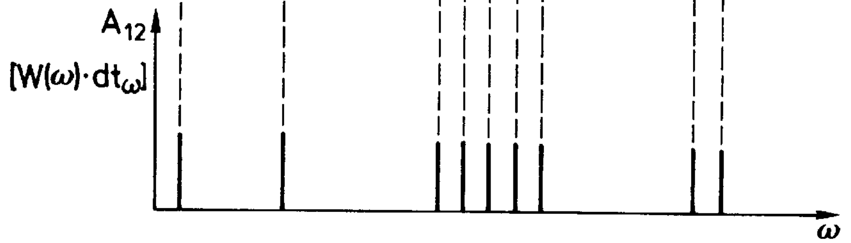
Figure 19:
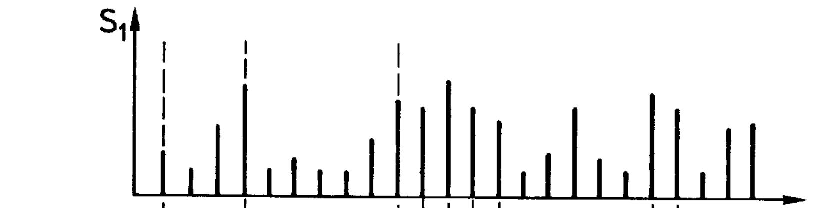
Figure 20:
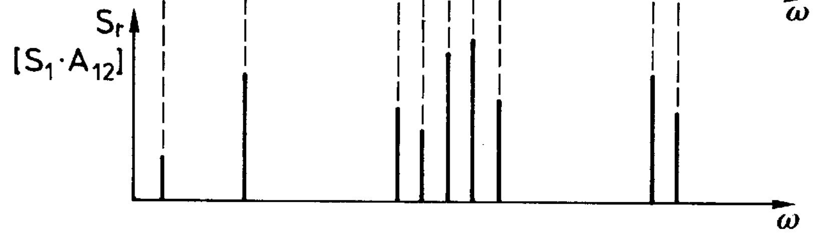
Figure 21:
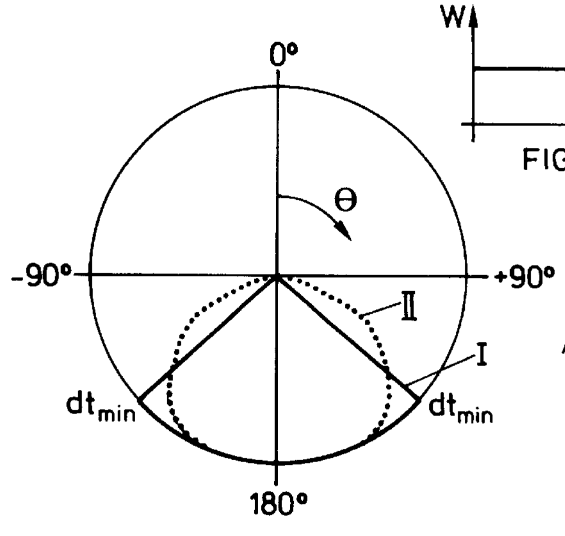
Figure 22A:
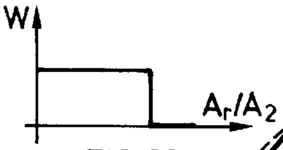
Figure 22:
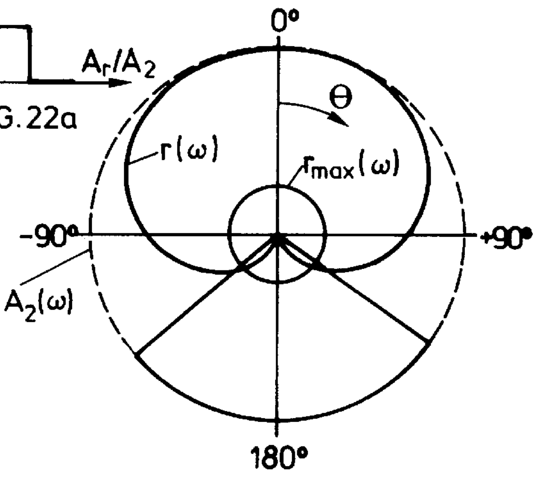
Figure 23:
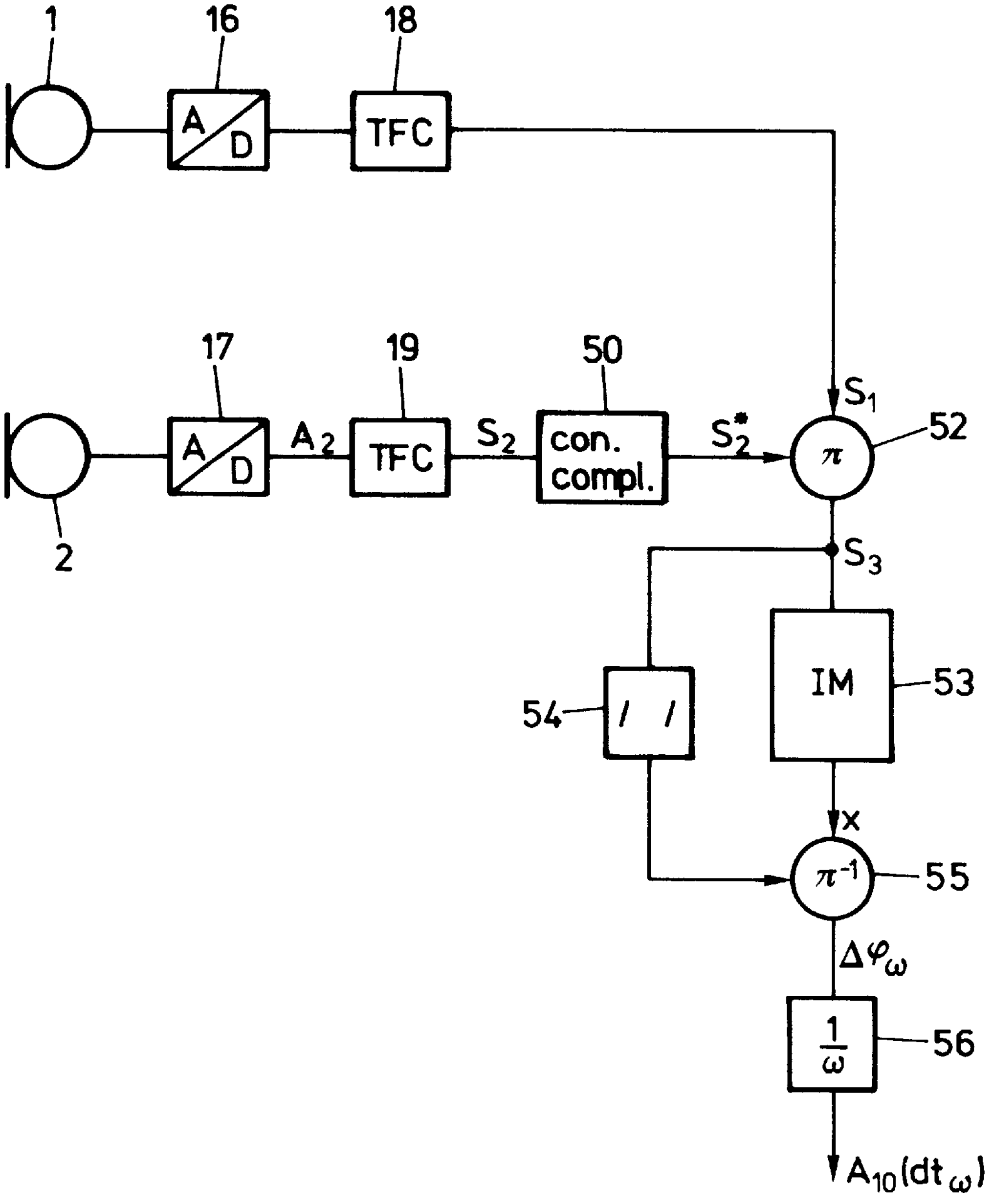
Figure 24:
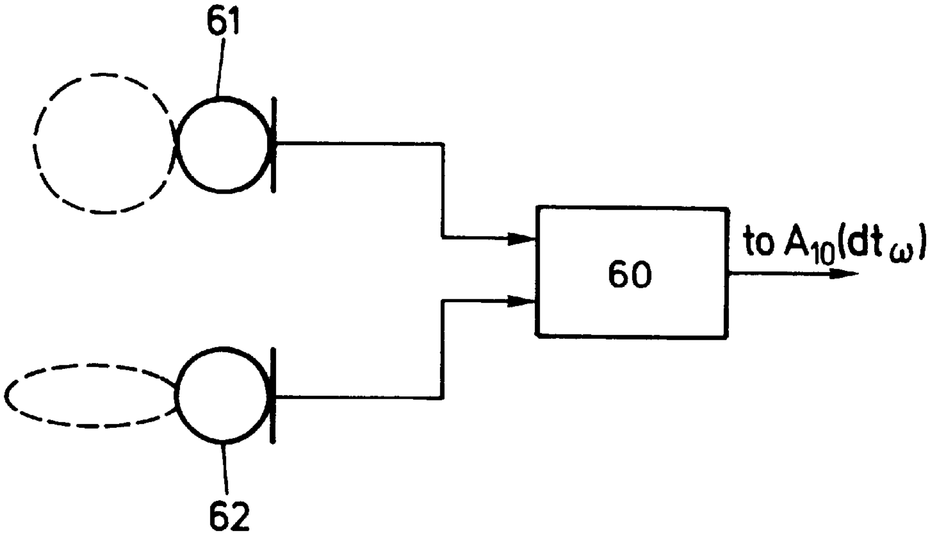
Figure 25:
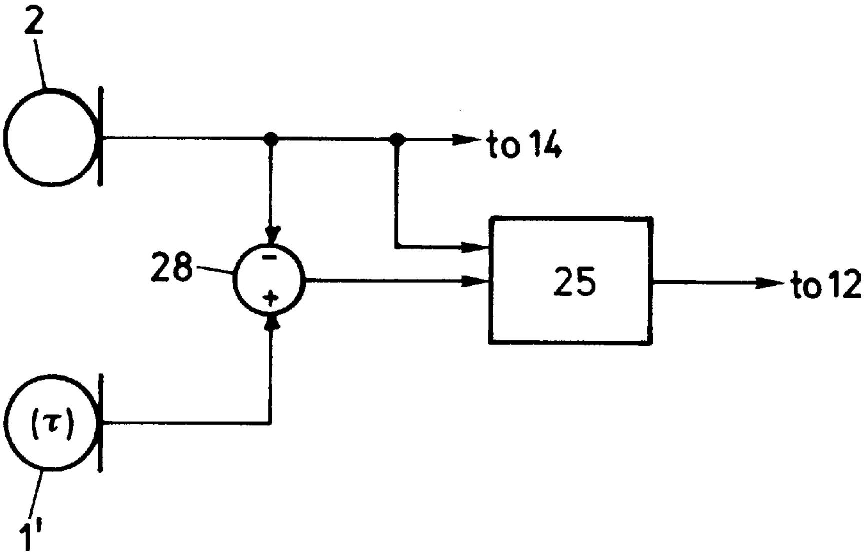

Other objects, advantages and specific embodiments of the present invention shall be exemplified with the help of further figures. The figures show:

FIG. 1: A functional block diagram of a two-cell directional microphone arrangement according to the prior art principle of "delay and sum";

FIG. 2: the first order cardoid amplification characteristic of prior art arrangement according to FIG. 1;

FIG. 3: departing from the prior art arrangement of FIG. 1 a further arrangement following up the technique of "delay and sum" for realising second order characteristic;

FIG. 4: the second order amplification characteristic as realised by the prior art arrangement according to FIG. 3;

FIG. 5: in dependency of frequency the amplification characteristic of the arrangement according to FIG. 1 or 3 at maximum amplification impinging angle of acoustical signals;

FIG. 6: a simplified functional block diagram of an inventive apparatus operating according to the inventive method and further showing the sequence of process signals;

FIG. 7: in a representation according to FIG. 6 a first preferred realisation form of an inventive apparatus operating according to the inventive method;

FIG. 8: in an inventive apparatus operating according to the inventive method according to FIG. 6 a further preferred form of realisation of a time delay detection unit;

FIG. 9: a polar diagram of signals as realised by the embodiment of FIG. 8 for explaining operation of a comparator unit as provided in the FIG. 8 embodiment;

FIG. 10: the course of comparison results in dependency of impinging angle of an acoustical signal and as realised by the embodiment according to FIG. 8;

FIG. 11: a preferred form of realising superimposing result signal dependency from impinging angle of an acoustical signal at an embodiment according to FIG. 8;

FIG. 12: in a representation according to FIG. 10 the course of comparison results as realised with a preferred embodiment resulting in the FIG. 11 dependency;

FIG. 13: in polar diagrammatic representation the dependency of superimposing result signals from impinging angle of acoustical signals and from frequency as realised by the embodiment according to FIG. 8;

FIG. 14: a preferred realisation form of the FIG. 8 embodiment, additionally counteracting frequency dependency as shown in FIG. 13;

FIG. 15: in a representation according to FIG. 13 the dependency of the superimposing result signal with normalisation as realised by the embodiment of FIG. 14 with a first preferred normalisation frequency function;

FIG. 16: a representation according to FIG. 15, realised with a second preferred normalisation frequency function at the embodiment of FIG. 14;

FIG. 17: a first (rigid line) and second (dashed line) preferred realisation form of amplitude filter characteristic at the embodiment of FIG. 6 or 7;

FIG. 18*a:* the effect of the amplitude filter amplitude versus amplitude transfer characteristic according to FIG. 17 (rigid line) on the output signal of the delay detection unit as provided in the embodiment of FIG. 6 or 7;

FIG. 18*b:* the representation of the output signal of a time delay detection unit passed through the amplitude filter with a transfer characteristic according to FIG. 17 (rigid line) and as realisable by the embodiment of FIG. 6 or 7;

FIG. 19: the spectrum of an acoustical signal converted into electrical and input to a controllable frequency filter as provided by the present invention according to FIG. 6;

FIG. 20: the electrical reception result signal realised by amplitude filter characteristic according to FIG. 17 (rigid line) and reception signal as exemplified in FIG. 19 at the inventive embodiment according to FIG. 6;

FIG. 21: the resulting dependency of amplification from impinging angle of an acoustical signal as realised by the FIG. 17 amplitude filter characteristic (rigid and dashed lines);

FIG. 22: the amplification versus impinging angle characteristic as realised by the FIG. 6 or FIG. 8, 14 embodiments of the invention, making use of an amplitude filter characteristic with a maximum to minimum spectral amplitude transfer behaviour;

FIG. 23: in a simplified signal/functional block diagram a further preferred embodiment of the invention;

FIG. 24: in a signal flow, functional block representation, a further mode of realisation of the time delay detection unit as shown in FIG. 6 and FIG. 25: in a signal flow, functional block representation, a further mode of realisation of the time delay detection unit following the technique as shown in FIG. 8 or FIG. 14.

In FIG. 6 there is shown in form of a functional block diagram, together with principle signal processing diagrams, the principle of the inventive method and apparatus.

At least two acoustical/electrical transducers 1 and 2, as especially of microphones or microphone cells, are provided with a predetermined mutual distance p along axis a. Acoustical signals IN are received by the transducers 1 and 2 as they impinge from different spatial directions θ. The acoustical signals IN have frequency spectra which vary in time. Output signals of transducer 1, $S_1(t,\omega)$ and of transducer 2, $S_2(t,\omega)$, are formed as electrical signals at the output of the transducers 1 and 2. Due to the mutual distance p of the two transducers 1 and 2—which is preferably smaller than 5 cm, preferably between 0.5 and 1.5 cm, especially for the inventive sensor being a one ear hearing aid apparatus—and as shown with the two respective pointer diagrams below the functional block diagram of FIG. 6, the acoustical signals IN impinge on the transducers 1 and 2 with a time delay dt, which may be expressed by the phase difference $\Delta\phi_\omega$ at each spectral frequency ω according to (1) $\Delta\phi_\omega=\omega.dt_\omega$, where $$dt_\omega = \frac{p}{c}\cos\theta_\omega. \tag{2}$$

If the source of acoustical signal IN is a point source, then the time delay $dt_\omega$ becomes equal for all spectral components at the different ω. The output signals $S_1$ and $S_2$ of the transducers 1 and 2 are operationally connected to the respective inputs of a time delay detection unit 10, which generates an output signal $A_{10}$ according to the spectral distribution of time delays $dt_\omega$, which are, as was explained, a function of the impinging angle θ at which the respective frequency components impinge on the transducers 1 and 2 and thus in fact of $\theta_\omega$. Purely as example a possible spectrum of output signal $A_{10}$ is also shown in FIG. 6. This spectrum varies in time according to the time variation of impinging acoustical signal IN. The output signal $A_{10}$ of time delay detection unit 10 is input to a weighing unit 12. As the spectrum of $dt_\omega$ with respective spectral amplitudes of $A_{10}$ is input to the weighing unit 12 with the preselected weighing transfer characteristic W, there results at a certain moment in time, as an output signal $A_{12}$, a spectral signal W(ω), as also shown as an example in FIG. 6. $A_{12}$ results from respectively weighing the spectral amplitudes of $A_{10}$ according to the characteristic W. As $A_{10}$ indicates according to $dt_\omega$ from which direction $\theta_\omega$ each frequency component of the acoustical signal IN impinges, its specific weighing by means of function W is nothing else than predetermining which impinging directions $\theta_\omega$ shall be amplified or attenuated. Thus, the weighing unit 12 determines with its characteristic W the beam shape.

The output signal $A_{12}$ is applied to a filter unit 14 with a controllable transfer filter characteristic. There, each spectral line of the time varying spectrum of the output signal $S_1(t,\omega)$ is amplified or attenuated according to the controlling spectrum $W_\omega \cdot A_{10\omega}$. Thus, unit 14 is a filter unit for input signal $S_1$ at which the transfer characteristic is varied, as controlled by $A_{12}$. In dependency of the kind of filter unit 14 the weighing unit 12, generally spoken, calculates adjustment of filter characteristic determining coefficients as a function of $A_{10}$.

Thus, along the channels 10 and 12 there is predetermined by the weighing transfer function W which spatial directions θ shall be "aimed" at. At the filter unit 14 this beam shaping information is applied to the electrical analogon $S_1$ of the acoustical signal IN, thus resulting in an output signal $S_r(t,\omega)$ representing the shaped reception signal.

By adjusting the weighing transfer function W by applying a control signal $C_W$ to a control input $C_{12}$, the beam form can be adjusted and thus acoustical zooming is realised.

As shown in dashed line, it may be advantageous to subject both transducer output signals to a controlled filtering at unit 14.

In FIG. 7 there is shown a first preferred form of realisation of the inventive principle according to FIG. 6. Thereby, the output signals $S_1$ and $S_2$ are first converted from analogue to digital form in respective analogue/digital converters 16 and 17. The digital output signals of the respective converters 16 and 17 are input to respective complex time domain/frequency domain converters 18 and 19.

The output spectra $S_1(t,\omega)$ and $S_2(t,\omega)$ of converters 18, 19 are input to the spectral time delay detection unit 10'. Unit 10' computes according to formula (1) the phase difference spectrum $\Delta\phi_\omega$ divided by the respective frequency ω to result in an output signal spectrum $A_{10}'$ according to the time delay $dt_\omega$, as was explained in connection with FIG. 6. The output signal of the time delay detection unit 1040 , $A_{10}'$, is further treated, as was explained in connection with FIG. 6, by the weighing filter unit 12 and the controllable filter unit 14. In the following table there is exemplified how the unit 10' operates. Out of the spectral phase distribution $\phi_{1n}$ of signal $S_1$ and $\phi_{2n}$ of signal $S_2$ the time delay $dt_\omega$ is calculated for each spectral line within an interesting spectral band.

| | $\omega_1$ | $\omega_2$ | $\omega_3$ | $\omega_n$ |
|---|---|---|---|---|
| S1 (ω) | $A_{11}$ | $A_{12}$ | $A_{13}$ | $A_{1n}$ |
| | $\phi_{11}$ | $\phi_{12}$ | $\phi_{13}$ | $\phi_{1n}$ |
| S2 (ω) | $A_{21}$ | $A_{22}$ | $A_{23}$ | $A_{2n}$ |
| | $\phi_{21}$ | $\phi_{22}$ | $\phi_{23}$ | $\phi_{2n}$ |
| $dt_{\omega n}$ | $\phi_{11} - \phi_{21}/\omega_1$ | $\phi_{12} - \phi_{22}/\omega_2$ | $\phi_{13} - \phi_{23}\omega/_3$ | $\phi_{1n} - \phi_{2n}/\omega_n$ |

So as to extract the phase information ϕ out of the two signals $S_1$ and $S_2$ the time domain to frequency domain conversion units 18 and 19 perform complex (real and imaginary) operation.

A second preferred realisation form of the present invention, and especially as concerns realisation of the time delay detection unit 10, shall be explained with the help of FIGS. 8 and 9.

The output signal of one of the transducers, as shown e.g. of transducer 1, $S_1(t,\omega)$) is fed to a time delay unit 20, wherein, in a first form of this realisation, signal $S_1$ is time delayed by a predetermined frequency independent time delay τ.

Looking back on FIG. 1, signal $S_1$ accords thus with signal $A_1$.

The output signal of time delay unit 20 thus accords with signal $A_1$' of FIG. 1.

The time delay signal according to $A_1$' is superimposed to the output signal $S_2(t,\omega)$ from transducer 2 at a superimposing unit 23 according to unit 3 of FIG. 1, thus resulting in an output signal according to $A_r(t,\omega)$ of FIG. 1. As is known, and as was explained in connection with FIG. 1, the output signal $A_r(t,\omega)$ depends from the impinging acoustical signal direction $\theta$ according to the first order cardoid beam of FIG. 2, which cardoid function nevertheless varies with frequency $\omega$. The output signal $A_r$ of superimposing unit 23 and e.g. the output signal $S_2(t,\omega)$ from transducer 2 are input to a ratio unit 25, as a comparator unit.

For understanding the functioning of ratio unit 25, attention is drawn to FIG. 9. In FIG. 9 the cardoid attenuation characteristic of output signal $A_r$ at a specific spectral frequency $\omega_1$ is shown. At a specifically considered impinging angle $\theta_o$ the output signal $A_r$ of superimposing unit 23 is $A_{ro}(\omega_1)$ with an amplitude value as indicated in FIG. 9. Simultaneously, at that frequency $\omega_1$ considered and at that impinging angle $\theta_o$ considered, the amplitude of signal $S_2$ is $A_{2o}(\omega_1)$ as also shown in FIG. 9. It must be emphasised that as the amplitude $A_{2o}$ varies, the amplitude of $A_{ro}$ varies proportionally. Thus, the ratio of $A_{ro}$ to $A_{20}$ according to FIG. 9 is indicative of the impinging angle $\theta_o$. In the division unit 25 of FIG. 8 there is formed for each spectral component amplitude the ratio of $A_r$ to $A_r$, wherefrom there results a signal spectrum at the output of division unit 25 with a ratio spectrum. The spectrum of $A_{10}$ according to FIG. 6 thus becomes the spectrum of an amplitude ratio which nevertheless is indicative of the impinging angle $\theta$, at which each frequency component of the spectrum of the acoustical signal impinges with respect to the axis a of the two transducers (see FIG. 6). In FIG. 8 the dotted line block indicates the delay detection unit 10 according to FIG. 6. Further signal processing is performed as was explained by means of FIG. 6, i.e. via weighing unit 12 and controllable filter unit 14.

In this embodiment it is possible to perform a time domain to frequency domain conversion at the output side of comparator unit 12.

Thus, the output ratio signal of unit 25 is a measure for the time delay $dt_\omega$ and is input to the weighing unit 12.

In FIG. 10 there is shown the course of the ratio $A_r$ to $A_o$ as a function of $\theta$ at a specific frequency $\omega_1$.

This amplitude ratio is shown for $\tau$ at unit 20 of FIG. 8 being selected to be $$\tau=p/c,$$

wherein p is the distance of the transducers 1 and 2 and c is the velocity of sound.

When selecting $\tau$ to be p/c and as may be seen from the cardoid beam function of FIG. 2 signal attenuation or dampening for $\theta$ near 0° becomes very high.

Thus, in this area of impinging angle $\theta$ any kind of noise in $A_2$ according to $S_2$ of FIG. 8 would falsify comparison result formed at unit 25. This problem can be eliminated by choosing a delay $\tau$ which is different, thereby preferably larger than p/c.

In FIG. 11 the resulting cardoid diagram is shown for $\tau$=1.2 p/c, whereas FIG. 12 shows in analogy to FIG. 10 the course of the amplitude of $A_r$ divided by the amplitude $A_2$.

Further, it must be noted that the cardoid function as shown in the FIGS. 2, 9 and 11 is only valid for one specific frequency considered. In fact, considering different frequencies, the cardoid function varies as shown in FIG. 13, wherein the amplitude $A_r$ of the output signal of superimposing unit 23 according to FIG. 8 is shown for p=12 mm, a delay $\tau$ of 42 microseconds and for frequencies of 0.5, 1, 2, 4 and 7.2 kHz. From this polar diagram the frequency dependency of the cardoid amplification function is clearly evident. Although such dependency may be neglected in a first approximation, in a preferred form of realising the inventive method principally as shown in FIG. 8, such dependency is taken into account. Thus, a preferred realisation form of the FIG. 8 technique is shown in FIG. 14. Here, the same reference numbers are used as in the FIGS. 7 or 8. The outputs of the transducers 1 and 2 are converted into digital form by respective analogue to digital converters 16, 17 and the resulting digital signal of transducer 1 is time delayed by a time delay $\tau$', which is larger than p/c. The output signal $S_2$ of transducer 2 is further converted into frequency domain by a linear (not complex) time to frequency domain conversion unit 18', whereas the output signal $A_r$ of superimposing unit 23 is converted to frequency domain at a linear time to frequency domain conversion unit 19'. The frequency dependent polar diagram according to FIG. 13 is taken into account by a normaliser unit 30 which is in fact a filter. In a first embodiment the transfer characteristic of the filter is selected proportional to $1/\omega$. This results in a frequency dependency of the pole diagram as is shown in FIG. 15 for the same distance and frequency values as shown in FIG. 13.

As may be seen, a good matching is achieved for small angles $\theta$ and frequencies up to about 4 kHz. At 4 kHz the deviation is about 10%, at $\theta$=180°.

A further, even improved normalisation function or filter characteristic at unit 30 of FIG. 14 is achieved when the filter characteristic is selected as a function $1/\sin(\omega)$. The result is shown in FIG. 16. The characteristics match well from 0.5 to 4 kHz. A further advantage of this normalisation technique is improved sensitivity in backwards direction. This improved sensitivity may be exploited for adaptive beam forming, that is for selectively eliminating noise sources from the rear side.

It is evident for the skilled artisan, that such normalisation may be performed also in signal path 1 to 23 and/or 2 to 23.

In this embodiment of FIG. 14 it is highly advantageous that only one-dimensional TFC's 18', 19' have to be used and not complex TFC's as in the embodiment of FIG. 7.

FIG. 24 shows in block diagram form, that the signal $A_{10}$ ($dt_\omega$) may also be generated as the output signal of a comparator unit 60 to which on one hand the output signal of an omnidirectional transducer 61, having equal amplification of its acoustical/electrical reception characteristic substantially irrespective of the impinging angle $\theta$ and the output signal of a directional transducer 62 with selected, beam shaped reception characteristic are led to.

According to FIG. 25 time delaying $\tau$ may also be performed by one of the transducers itself.

Thereby, in the embodiment of FIG. 25 as well as of FIG. 8 $\tau$ may be selected to be zero.

With the help of FIG. 23 a further preferred embodiment, especially of realising the time delay detection unit 10 of FIG. 6 shall be explained. The output signals of the transducers 1 and 2 are first converted by respective analogue to digital converters 16 and 17 and then by respective time domain to frequency domain converters 18, 19 finally into frequency domain. One signal, as an example $S_2$, of the converted output signals of the transducers, which, after time to frequency domain conversion may be represented as a spectrum of $S_{2\omega}$ pointers, is converted to its conjugate complex pointers at a conversion unit 50. At the output of this unit 50, the conjugate complex pointers $S^*_{2\omega}$ are generated. This spectrum $S_2^*$ and the pointer spectrum $S_1$ are multiplied to form the scalar product spectrum $S_3$ in a multiplication unit 52. As may be shown, the pointers $S_{3\omega}$ of spectrum $S_3$ have a phase angle with respect to the real axis, which is $\Delta\phi_\omega$.

Thus, the imaginary part of the pointers $S_{3\omega}$ of $S_3$ become $$\mathrm{Im}\,(S_{3\omega})=|S_{3\omega}|\sin(\Delta\phi_\omega) \tag{3}$$

with $$\Delta\phi_\omega=\omega\cdot(p/c)\cdot\cos(\theta_\omega) \tag{4}$$

According to FIG. 23, a conversion unit 53 forms the imaginary part of the pointers $S_{3\omega}$ and a further unit 54 forms the amplitudes $|S_{3\omega}|$ of these pointers.

For small values of $\Delta\phi_\omega$ the sinus in (3) may be approximated by $\Delta\phi_\omega$ itself, so that there results from (3)

$$\mathrm{Im}(S_{3\omega})=|S_{1\omega}\cdot S^*_{2\omega}|\omega((p/c)\cdot\cos\,(\theta_\omega) \tag{3'}$$

Thus, and as performed by unit 55, dividing the imaginary parts Im $(S_{3\omega})$ of the pointers $S_{3\omega}$ of spectrum $S_3$ by the respective values of the scalar product according to $|S_{3\omega}|$, there results an output signal which accords with $\Delta\phi_\omega$. As was already explained with the help of FIG. 7, $\Delta\phi_\omega$ is further divided in unit 56 by the respective pointer frequency $\omega$. The resulting signal is $A_{10}$ according to FIG. 6 or $A_{10}'$ according to FIG. 7.

All the units 50, 52, 53, 54, 55 and 56 are preferably realised in one calculator unit.

Let's turn back to the generic block diagram of FIG. 6 having described different possibilities of realising the delay detector unit 10.

By means of the FIGS. 17 to 22 we will further explain with a specific example the effect of amplitude filter unit 12 and of controllable filter unit 14.

In FIG. 17 there are shown examples of two weighing signal characteristics of unit 12. According characteristic I each $dt_\omega$ spectral line amplitude of signal $A_{10}$ (see FIG. 6) is attenuated to zero, if such amplitude is below or above predetermined values $dt_{min,\omega}$, $dt_{max,\omega}$ and is set to be "one" if such spectral component amplitude is between these two values.

Such selection of weighing function W results in an output signal spectrum $A_{12}$, as shown in the FIGS. 18*a* and 18*b*.

The FIGS. 18*a* and 18*b* are self-explanatory for the skilled artisan.

FIG. 19 shows a spectrum example of signal $S_1$. At the controllable filter unit 14 all spectral lines of $S_1$ (Fig. b) are amplified by the value 1 according to $A_{12}$ or are nullified according to zero values of $A_{12}$. This results, according to FIG. 20, in a spectrum $S_r$ as an output signal spectrum of controllable filter unit 14 of FIG. 6. If the weighing function I of FIG. 17 is applied to the technique according to FIG. 7 there results a beam form as shown in FIG. 21 in strong lines. If an amplitude filter characteristic is applied as shown by II in FIG. 17, there results the characteristic as shown in FIG. 21 in dashed line.

FIG. 22 shows the resulting beam if in analogy to FIG. 17 and with an eye on FIGS. 8 and 9 all ratio values which exceed $(A_r/A_2)$max are discarded. This is realised by the amplitude filter characteristic as also indicated in FIG. 22.

In FIG. 22 the ratio $A_r/A_2$ is denoted with $r(\omega)$.

It is clear for the skilled artisan that only examples of the invention were described with the help of the figures. For instance more than two transducers or microphones arranged in linear, planar or spatial array form can be used. Additionally, directional microphones may be used instead of the omnidirectional. Beam forming following the inventive principle can also be made by the combination of the functions of two or more microphones. As is perfectly clear to the skilled artisan also the delay detector can be realised in many other ways. Further, normalisation, which was explained with the help of normaliser unit 30 in FIG. 14, may clearly be done by providing time domain to frequency domain conversion just after the analogue to digital converters 16 and 17 and providing frequency-specific arrays or tables of time delays $\tau_\omega$.

What is claimed is:

1. A method for electronically forming a predetermined characteristic of amplification in dependency of direction ($\theta$) from which acoustical signals (IN) are received at at least two spaced apart acoustical/electrical transducers (1, 2), comprising, at least within a predetermined frequency band, the steps of:

repetitively determining from signals ($S_1$, $S_2$) dependent from said acoustical signals a respective mutual delay signal ($dt_\omega$) according to reception delay at said at least two transducers;

subjecting a signal dependent from the output signal ($S_1$) of at least one (1) of said at least two transducers (1, 2) to filtering with a filtering transfer characteristic (14);

controlling said filtering transfer characteristic (14) in dependency of said mutual delay signal ($A_{12}$);

exploiting a signal dependent from the output signal of said filtering (14) as electrical reception signal ($S_r$).

2. The method of claim 1, further comprising the step of determining said mutual delay signal ($dt_\omega$) as a spectral signal.

3. The method of claim 1, further comprising the step of performing said repetitive determining from said signals ($S_1$, $S_2$) converted into frequency domain.

4. The method of claim 1, comprising the step of subjecting said signal dependent from the output signal ($S_1$) to said filtering converted into frequency domain.

5. The method of claim 4, further comprising the step of reconverting said signal exploited into time domain.

6. The method of claim 1, further comprising the step of performing said determining by monitoring phase difference of spectral components of said signals and dividing said phase difference monitored by the frequency of said respective spectral components.

7. The method of claim 1, thereby performing said determining by providing one of said at least two transducers with an at least approximately omnidirectional acoustical to electrical reception characteristic;

providing one of said at least two transducers with a directional, beam-shaped acoustical to electrical reception characteristic;

comparing signals dependent from the output signals of said at least two transducers and exploiting the result signal of said comparing as said mutual delay signal.

8. The method of claim 7, further comprising the step of normalising at least one of the comparing result signal, of the superimposing result signal and of at least one of said dependent signals with a frequency dependent normalising function (30).

9. The method of claim 7, further comprising the step of performing said comparing by spectrally forming the ratio of amplitudes of the superimposing result signal and of at least one of said dependent signals.

10. The method of claim 1, further comprising the step of performing said determining by superimposing signals dependent from the output signals of said at least to transducers and comparing the result signal of said superimposing and at least one of said dependent signals.

11. The method of claim 10, further comprising the step of delaying one of said dependent signals before said superimposing by a predetermined or frequency dependent time amount.

12. The method of claim 1, further comprising the step of performing said determining by converting signals dependent from the output signals of said at least two transducers into frequency domain;

forming the conjugate complex pointers of one of said signals converted;

multiplying the pointers of the other of said signals converted with said conjugate complex pointers to get multiplication result pointers;

forming the amplitudes of said multiplication result pointers;

forming the imaginary pointers components of said multiplication result pointers;

forming the ratio of said imaginary pointer components and said amplitudes multiplied by the respective frequency, the result signal of said ratio forming being said respective control delay signal in spectral representation.

13. The method of claim 11, further comprising the step of performing said delaying with a time delay which is different from, preferably larger than the quotient of the mutual distance (p) of said at least two transducers (1, 2) and velocity (c) of sound.

14. The method of claim 1, further comprising the step of controlling said transfer characteristic by subjecting said delay spectral signal to weighing and controlling said transfer characteristic by the result of said weighing.

15. The method of claim 14, further comprising the step of adjusting said predetermined characteristic of amplification by adjusting a weighing characteristic for said weighing.

16. An acoustical sensor apparatus comprising at least two acoustical/electrical transducers (1, 2) at a predetermined mutual distance (p);

a time delay detection unit (10) with at least two inputs and an output, the inputs thereof being respectively operationally connected to the outputs of said at least two transducers (1, 2), said time delay detection unit (10) generating an output signal ($A_{10}$) in dependency of the time delay of acoustical signals (IN) impinging on said at least two transducers (1, 2);

a weighing unit (12) with a predetermined weighing characteristic and with an input and with an output, the input thereof being operationally connected to the output of said time delay detection unit (10);

a filter unit (14) with a controllable transfer characteristic and with at least one input, a characteristic control input and an output, the input thereof being operationally connected to the output of at least one of said at least two transducers, the control input thereof being operationally connected to the output of said weighing unit (12), the filter unit (14) generating an output signal ($S_r$) in dependency of its input signal and said characteristic controlled by the signal ($A_{12}$) applied at said control input, being dependent from said output signal of said delay detection unit converted by said weighing characteristic of said weighing unit.

17. The apparatus of claim 16, said control input of said filter unit (14) receiving said output signal of said delay detection unit in frequency domain mode.

18. The apparatus of claim 16, further comprising time domain to frequency converters interconnected between said at least two transducers and said time delay detection unit (10), said detection unit being a spectral time delay detection unit.

19. The apparatus of claim 16, wherein one of said at least two transducers is a transducer with at least approximately an omnidirectional acoustical/electrical reception characteristic on said time delay detection unit comprises a comparator unit, the inputs thereof being operationally connected to the outputs of said at least two transducers, the output of said comparator unit being operationally connected to the output of said time delay detection unit.

20. The apparatus of claim 16, said time delay detection unit comprising a superimposing unit, the inputs thereof being operationally connected to the outputs of said at least two transducers, the output thereof being operationally connected to the output of said time delay detection unit.

21. The apparatus of claim 20, wherein said time delay detection unit comprises a time delay unit (20) with an input operationally connected to the output of one of said transducers (1) and with an output operationally connected to one input of said superimposing unit (23), the second input of said superimposing unit being operationally connected to the output of the second of said at least two transducers (2).

22. The apparatus of claim 21, wherein the output of said superimposing unit being operationally connected to one input of a comparator unit (25), the second input thereof being operationally connected to said output of said second transducer (2);

the output of said comparator unit being the output of said spectral delay detector unit.

23. The apparatus of claim 21, wherein said time delay unit (20) performs signal delaying by an amount which is different than given by the mutual distance (p) of said transducers (1, 2) divided by velocity of sound (c), which is preferably larger.

24. The apparatus of claim 16, wherein said time delay detection unit comprises a normalizing filter unit (30) with predetermined transfer characteristic, which is provided at its input and/or output.

25. The apparatus of claim 20, wherein said comparator unit is a ratio forming unit of amplitudes of respective frequency components applied to its inputs.

26. The apparatus of claim 16, wherein said time delay detection unit (10) is a spectral time delay detection unit and performs spectral phase difference measurement ($\Delta\phi\omega$) and division of spectral phase difference by the respective frequency ($\omega$).

27. The apparatus of claim 26, wherein said time delay detection unit comprises a calculator unit with two inputs operationally connected to the outputs of said at least two transducers which forms the conjugate complex pointers of a signal at one of its inputs;

multiplies said conjugate complex pointers with the respective pointers of the signal applied to its second input;

divides the imaginary part of multiplying result pointers by the amplitude of said multiplying result pointers;

further divides the dividing result pointers by their respective frequency and emits as an output signal at its output the result pointers of said further dividing.

28. The apparatus of claim 16, further comprising a time to frequency domain conversion unit (18') interconnected between the output of said second transducer and said filter unit (14).

29. The apparatus of claim 16, further comprising a time to frequency domain conversion unit (19') interconnected between the output of said superimposing unit (23) and control input of said frequency filter unit (14).

30. The apparatus of claim 16, being a hearing aid apparatus, the mutual distance of said at least two transducers being 4 cm at most, preferably 0.5 cm to 1.5 cm.

31. The apparatus of claim 16, said weighing unit comprising a control input to adjust weighing characteristic of said weighing unit.

* * * * *